United States Patent
Abe et al.

(10) Patent No.: US 8,212,228 B2
(45) Date of Patent: Jul. 3, 2012

(54) EXTREME ULTRA VIOLET LIGHT SOURCE APPARATUS

(75) Inventors: Tamotsu Abe, Hiratsuka (JP); Toshihiro Nishisaka, Hiratsuka (JP); Hiroshi Someya, Hiratsuka (JP); Masato Moriya, Hiratsuka (JP); Takeshi Asayama, Hiratsuka (JP); Hideo Hoshino, Hiratsuka (JP); Hakaru Mizoguchi, Hiratsuka (JP)

(73) Assignees: Komatsu Ltd., Tokyo (JP); Gigaphoton Inc., Tokyo (JP)

( * ) Notice: Subject to any disclaimer, the term of this patent is extended or adjusted under 35 U.S.C. 154(b) by 151 days.

(21) Appl. No.: 12/382,108

(22) Filed: Mar. 9, 2009

(65) Prior Publication Data

US 2009/0224181 A1  Sep. 10, 2009

(30) Foreign Application Priority Data

Mar. 10, 2008 (JP) ................. 2008-059179

(51) Int. Cl.
  *H05G 2/00* (2006.01)
(52) U.S. Cl. ............ 250/504 R; 250/493.1; 250/503.1; 315/111.01; 315/111.21
(58) Field of Classification Search ............ 250/493.1, 250/503.1, 504 R; 315/111.01, 111.11, 111.21, 315/111.71
See application file for complete search history.

(56) References Cited

U.S. PATENT DOCUMENTS

| | | |
|---|---|---|
| 2006/0091109 A1 | 5/2006 | Partlo et al. |
| 2006/0249699 A1* | 11/2006 | Bowering et al. ......... 250/504 R |
| 2008/0099699 A1* | 5/2008 | Yabuta et al. ............. 250/504 R |
| 2008/0237501 A1* | 10/2008 | Hosokai et al. .......... 250/504 R |

FOREIGN PATENT DOCUMENTS

| | | |
|---|---|---|
| JP | 2004-533704 | 11/2004 |
| JP | 2005-032510 | 2/2005 |
| JP | 2006-80255 | 3/2006 |
| JP | 2006-202671 | 8/2006 |

OTHER PUBLICATIONS

Japanese Office Action, and partial English translation thereof, issued in Japanese Patent Application No. 2008-059179 dated Apr. 17, 2012.

\* cited by examiner

*Primary Examiner* — Michael Maskell
*Assistant Examiner* — Hanway Chang
(74) *Attorney, Agent, or Firm* — McDermott Will & Emery LLP

(57) ABSTRACT

An extreme ultra violet light source apparatus prevents debris staying and accumulating within a chamber from contaminating the chamber and deteriorating the performance of an important optical component. The extreme ultra violet light source apparatus includes: a chamber in which extreme ultra violet light is generated; a driver laser for applying a laser beam to a target supplied to a predetermined position within the chamber to generate plasma; a collector mirror provided within the chamber, for collecting and outputting the extreme ultra violet light radiated from the plasma; an exhaust path communicating with the chamber and connected to an exhausting device, for maintaining an interior of the chamber at a certain pressure; a catching chamber provided in the exhaust path, for catching debris generated from the plasma; and a collecting unit for collecting the caught debris out of the chamber.

16 Claims, 9 Drawing Sheets

FIG.6

| KIND OF REACTION PRODUCT | BOILING POINT (°C) |
|---|---|
| $SnH_4$ | -52 |
| $SnF_2$ | 850 |
| $SnF_4$ | 705 |
| $SnCl_2$ | 623 |
| $SnCl_4$ | 114 |
| $SnBr_2$ | 620 |
| $SnBr_4$ | 202 |
| $SnI_2$ | 714 |
| $SnI_4$ | 364 |

EXTREME ULTRA VIOLET LIGHT SOURCE APPARATUS

BACKGROUND OF THE INVENTION

1. Field of the Invention

The present invention relates to an extreme ultra violet (EUV) light source apparatus to be used as a light source of exposure equipment.

2. Description of a Related Art

In recent years, as semiconductor processes become finer, photolithography has been making rapid progress to finer fabrication. In the next generation, microfabrication of 100 nm to 70 nm, further, microfabrication of 50 nm or less will be required. Accordingly, in order to fulfill the requirement for microfabrication of 50 nm or less, for example, exposure equipment is expected to be developed by combining an EUV light source generating EUV light with a wavelength of about 13 nm and reduced projection reflective optics.

As the EUV light source, there are three kinds of light sources, which include an LPP (laser produced plasma) light source using plasma generated by applying a laser beam to a target (hereinafter, also referred to as "LPP EUV light source apparatus"), a DPP (discharge produced plasma) light source using plasma generated by discharge, and an SR (synchrotron radiation) light source using orbital radiation. Among them, the LPP type EUV light source apparatus has the advantages that extremely high intensity close to black body radiation can be obtained because plasma density can be considerably made larger, that light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP type EUV light source apparatus is considered to be predominant as a light source for EUV lithography requiring power of more than several tens of watts.

Here, a principle of generating EUV light in the LPP type EUV light source apparatus will be briefly explained. When laser light is applied to a target material supplied into a vacuum chamber, the target material is excited and plasmarized. Various wavelength components including EUV light are radiated from the plasma. Then, the EUV light is reflected and collected by using an EUV collector mirror that selectively reflects a desired wavelength component (e.g., a component having a wavelength of 13.5 nm), and outputted to an exposure unit.

In the LPP EUV light source apparatus, when plasma is generated by applying a laser beam to a target, especially, if debris containing fast ions, neutral particles, and residual droplets emitted from the plasma are left, the operation of the EUV light source apparatus is disturbed. That is, the fast ions scrape (or sputter) the structures within the chamber such as a collector mirror, a nozzle of a target supply unit, and so on, and change the shapes of those structures. When the shape of the collector mirror changes, the reflectance of the collector mirror becomes lower and the output as the EUV light source becomes lower. Further, regarding the other structures, their functions are deteriorated and the operation as the EUV light source is hindered due to shape changes. Furthermore, the neutral particles and the residual droplets of the target are deposited on the structures including the collector mirror within the chamber and decrease the function of the EUV light source apparatus. For example, in a turbo-molecular pump for maintaining the degree of vacuum within the chamber, if the neutral particles and the residual droplets are deposited on turbine blades, the exhaust velocity becomes lower and, in the worst case, the blades collide with each other and are damaged, the turbo-molecular pump breaks down, and the EUV light source apparatus no longer operates.

A technology of protecting structures within the chamber from these fast ions, neutral particles, and/or residual droplets is called a mitigation technology, and various technologies have been proposed and implemented in the process of development of EUV light source. Japanese Patent Application Publication JP-P2006-80255A discloses a technology of protecting a collector mirror by applying a magnetic field into a chamber and ionizing neutral particles, and trapping the charged particles by the applied magnetic field. Further, U.S. Patent Application Publication US 2006/0091109 A1 discloses an EUV light source apparatus in which a reactive gas is introduced into a chamber and the attached material to a collector mirror and so on are allowed to react with the reactive gas and are exhausted.

The mitigation technology conventionally used is intended to prevent the deterioration of the performance of main optical components such as a collector mirror due to attachment of debris flying from the plasma and sputtering by the debris. Accordingly, even if the debris can be prevented from reaching the main optical components such as a collector mirror, the LPP EUV light source apparatus cannot stably be run in a long period. That is, in the EUV light source apparatus, the debris, which are produced from the plasma when a laser beam is applied to a target to generate the plasma for EUV light generation, stay and gradually accumulate within the chamber, and the accumulated debris contaminate the interior of the chamber.

Accordingly, there are problems that the accumulated debris are deposited on the main optical components, and thereby, reduce the reflectance or transmittance of the main optical components and deteriorate the performance of the main optical components, and the laser beam and EUV light are scattered due to increase of debris gradually staying within the chamber and efficient EUV light generation and collection are inhibited. On this account, it has been necessary to clean the interior of the chamber while the generation of EUV light is stopped at regular time intervals. Further, there is a problem that the staying debris enter the pump attached for evacuating the chamber and deteriorate the evacuation performance of the pump, and the operation time of the apparatus becomes shorter for maintenance of the pump. In any case, the long-term operation stability of the LPP EUV light source apparatus is deteriorated by the debris dispersing and staying within the chamber for a long period, and resolving these problems has been an issue.

BRIEF SUMMARY OF THE INVENTION

The present invention has been achieved in view of the above-mentioned problems. A purpose of the present invention is to provide an extreme ultra violet light source apparatus in which debris staying and accumulating within a chamber can be prevented from contaminating the chamber, deteriorating the performance of important optical component such as a collector mirror, and deteriorating the performance of a vacuum intake and exhausting unit, and extreme ultra violet light can stably be generated for a long period.

In order to accomplish the above-mentioned purpose, an extreme ultra violet light source apparatus according to one aspect of the present invention is an extreme ultra violet light source apparatus for generating extreme ultra violet light by applying a laser beam to a target, and including: a chamber in which extreme ultra violet light is generated; a driver laser for applying a laser beam to a target supplied to a predetermined position within the chamber to generate plasma; a collector mirror provided within the chamber, for collecting the extreme ultra violet light radiated from the plasma to output the extreme ultra violet light; an exhaust path communicating with the chamber and connected to an exhausting device, for maintaining an interior of the chamber at a certain pressure; a catching chamber provided in the exhaust path, for catching debris generated from the plasma; and a collecting unit for collecting the caught debris out of the chamber.

Further, an extreme ultra violet light source apparatus according to another aspect of the present invention is an extreme ultra violet light source apparatus for generating extreme ultra violet light by applying a laser beam to a target, and including: a chamber in which extreme ultra violet light is generated; a driver laser for applying a laser beam to a target supplied to a predetermined position within the chamber to generate plasma; a collector mirror provided within the chamber, for collecting the extreme ultra violet light radiated from the plasma to output the extreme ultra violet light; an exhaust path communicating with the chamber and connected to an exhausting device, for maintaining an interior of the chamber at a certain pressure; a catching and reaction chamber provided in the exhaust path, for catching debris generated from the plasma, and making the caught debris react with an reactive gas to generate a reaction product gas; and a collecting unit connected to the exhaust path, for treating the reaction product gas to collect the caught debris out of the chamber.

According to the present invention, by catching the debris within the chamber in the exhaust path and collecting the caught debris out of the chamber without stopping the generation of EUV light, the inserted target material can be collected or removed, the intervals of cleaning operation within the chamber while releasing the vacuum can be greatly increased, the EUV light source apparatus can be continuously operated at a practical level, and the target material can be effectively utilized so that the operation cost of the EUV light source apparatus can be reduced.

BRIEF DESCRIPTION OF THE DRAWINGS

FIG. 6 is a table showing boiling points of reaction products of halogen gas and tin at one atmosphere;

DETAILED DESCRIPTION OF THE INVENTION

Figure 1:
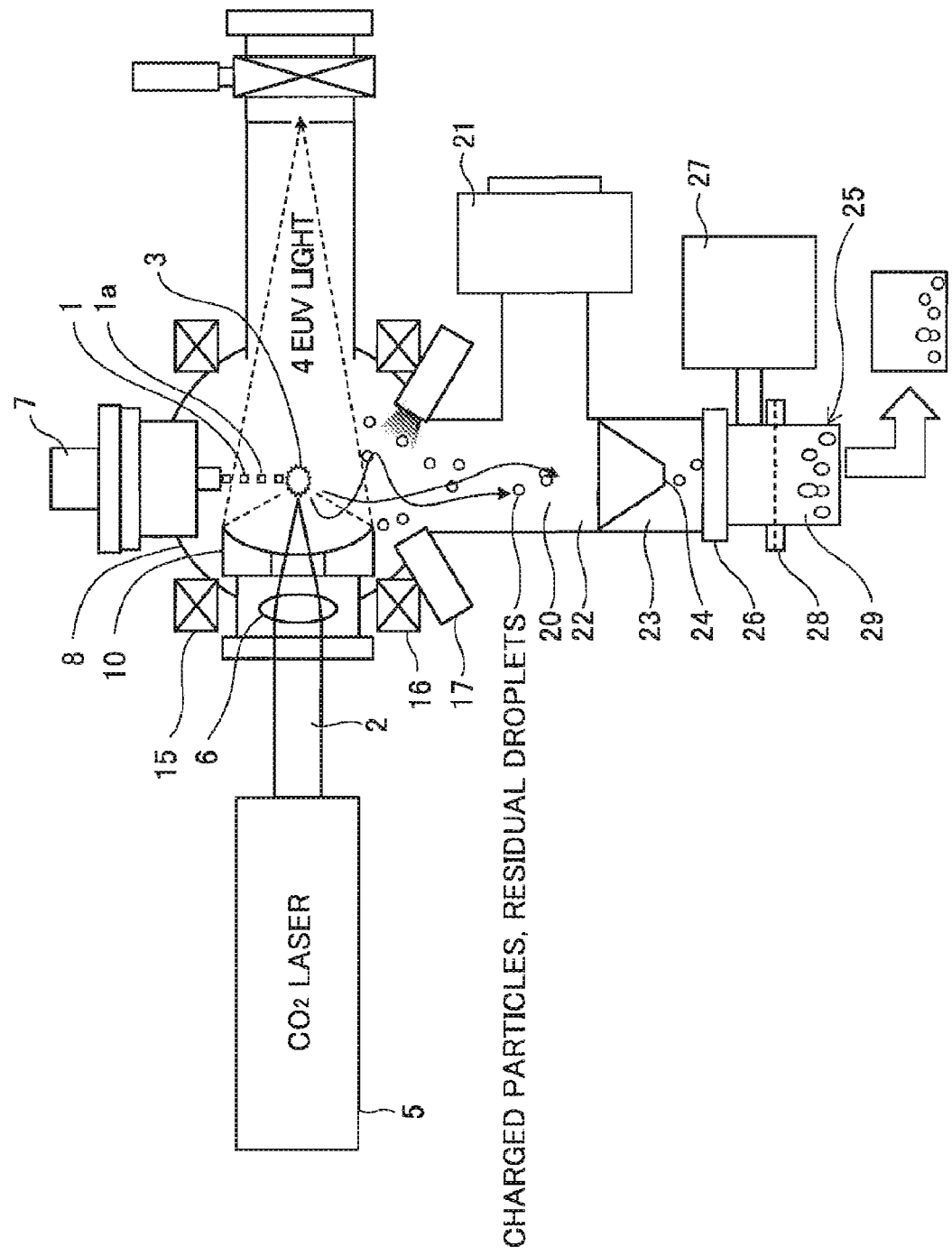
FIG. 1 shows an internal structure of an EUV light source apparatus according to the first embodiment of the present invention.

Hereinafter, preferred embodiments of the present invention will be explained in detail by referring to the drawings. The same reference characters are assigned to the same component elements and the description thereof will be omitted.

FIG. 1 is a diagram for explanation of the first embodiment of the present invention. Referring to FIG. 1, a basic configuration and an operation of an EUV light source apparatus according to the embodiment will be explained. The EUV light source apparatus shown in FIG. 1 employs a laser produced plasma (LPP) system for generating EUV light by applying a laser beam to a target material for excitation.

As shown in FIG. 1, the EUV light source apparatus includes a chamber 8 in which EUV light is generated, a target supply unit 7 for supplying a target 1 to a predetermined position within the chamber 8, a driver laser 5 for generating an excitation laser beam 2 to be applied to the target 1, a laser beam focusing optics 6 for collecting the excitation laser beam 2 generated by the driver laser 5, and a collector mirror 10 for collecting EUV light 4 emitted from plasma 3 generated when the excitation laser beam 2 is applied to the target 1 and outputting the EUV light 4.

In the EUV light source apparatus, for example, a metal ((liquid-state or solid-state tin (Sn)) is used as the target 1, and a carbon dioxide ($CO_2$) laser that can generate light having a relatively long wavelength is used as the driver laser 5. Tin is used as the target 1 because it has a high conversion efficiency from laser beam energy to EUV light energy. When a carbon dioxide laser is applied to the tin target, the conversion efficiency is about 2% to 4%. On the other hand, when another material, for example, xenon (Xe) is used as the target 1, the conversion efficiency is about 1%. As a form of the target, jet or droplets of melted tin or tin-coated wire or rotary disk is used. As below, the case where the carbon dioxide laser is applied to the tin target will be explained as an example. However, in the present invention, the kinds of target materials and laser light sources are not limited to these and various kinds of target materials and laser light sources may be used.

The laser beam focusing optics 6 includes at least one lens and/or at least one mirror. The laser beam focusing optics 6 may be located inside the vacuum chamber 8 as shown in FIG. 1, or outside the vacuum chamber 8.

The collector mirror 10 is a collection optics for collecting light by selectively reflecting a predetermined wavelength component (e.g., EUV light near 13.5 nm) of the various wavelength components emitted from the plasma 3. The collector mirror 10 has a concave reflecting surface, and a multilayer film of molybdenum (Mo) and silicon (Si) for selectively reflecting EUV light having a wavelength component near 13.5 nm is formed on the reflecting surface.

Furthermore, details of the EUV light source apparatus according to the first embodiment of the present invention will be explained. Regarding the target 1, the melted tin is processed into droplets to be a droplet target 1$a$, and outputted from a nozzle of the target supply unit 7. In droplet generation by the continuous jet method typically used, for example, when droplets of about 20 μm in diameter are outputted, the droplets are generated at several tens of megahertz. By culling the droplets in the target supply unit, a droplet line at 100 kHz is outputted from the nozzle. The initial speed when the droplets are outputted is about 100 m/sec, for example.

When the carbon dioxide laser beam having a repetition frequency of 100 kHz, energy of several tens of millijoule, a pulse width of several tens of nanoseconds is collected and applied to the droplet line, plasma is generated. In this regard, the laser beam and the target output are synchronously controlled by a synchronous control device (not shown) so that one-pulse laser beam is applied for one droplet.

The light having a wavelength of 13.5 nm of the emitted light emitted from the plasma is collected by the collector mirror and projected onto an exposure unit. The space in which the plasma is generated is isolated from the air and the degree of vacuum of several pascal or less is maintained by a turbo molecular pump (TMP). Such a degree of vacuum is maintained for preventing the absorption of EUV light by the residual gas and effectively using the influence and effect of a magnetic field, which will be explained later. That is, if the gas pressure within the chamber is high, the mean free path is short and the time period, in which charged particles move without collision while receiving the influence of the magnetic field, is short, and thereby, the deflection effect or focusing effect on the charged particles due to the influence of magnetic field becomes weak.

A static magnetic field is applied into the chamber by a magnetic generating unit including an electromagnet or the like. In the embodiment, for example, coils 15 and 16 are provided above and under the plasma generation space of the chamber 8, respectively, and a mirror magnetic field is formed by these coils. Further, a charging unit 17 for charging neutral particles in the magnetic field is provided in the chamber 8. As the charging unit 17, an electron beam unit may be used, or a high-frequency wave unit or microwave unit may be used. As the microwave unit, an electron cyclotron resonance (ECR) unit may be used.

When plasma is generated, debris containing fast ions, neutral particles, and residual droplets are generated following the plasma generation. The fast ions are deflected by the mirror magnetic field generated within the chamber 8 and move toward the upper part and lower part of the chamber 8. Among the ions, the fast ions moving toward the upper part of the chamber 8 are focused near the nozzle of the target supply unit 7, collide with the tin vapor injected from the nozzle of the target supply unit 7, the fast ions, and/or neutral particles generated by the collision of the fast ions, and lose energy and charge and become neutral particles. On the other hand, the fast ions moving toward the lower part of the chamber 8 are focused toward the central axis of the mirror magnetic field, collide with the fast ions and neutral particles generated by the collision of the fast ions, and lose energy and charge and become neutral particles. The neutral particles existing in the lower part of the chamber are charged by the charging unit 17 again, and further guided to the lower part of the chamber 8 by the influence of the magnetic field.

Here, experiments by the inventors have confirmed that many of the particles generated from plasma generated by the combination of the carbon dioxide laser and the tin target are neutral nanoparticles having diameters of several to several tens of nanometers. The target material has an initial speed of about 100 m/sec and has initial momentum. Accordingly, the generated nanoparticles similarly hold the initial momentum. The generated nanoparticles are focused toward the central axis in the downward direction of the chamber because of the initial output momentum and the deflection and focusing effect of the magnetic field while diffusing due to pressure at plasma generation.

The residual droplets are relatively large particles having diameters of several micrometers or more and relatively large masses, and therefore, when charged, are relatively hard to deflect with the magnetic field. However, the residual droplets also hold the initial momentum. Further, since the residual droplets have relatively large masses, the diffusion speed following the plasma generation is lower than that of neutral particles. Therefore, the residual droplets also move toward the lower part of the chamber.

As explained above, most of the debris of fast ions, neutral particles, residual droplets, and so on following the plasma generation are focused toward the lower part of the chamber and are caught. Accordingly, the amount of these debris colliding with and attached to the structures within the chamber is small and the deterioration in the function as the EUV light source is prevented.

The debris moving toward the lower part of the chamber move to an exhaust path 20. In the exhaust path 20, the debris are guided to an exhaust chamber 22 connected to the chamber 8 by a debris exhaust TMP (turbo molecular pump) 21. The debris guided to the exhaust chamber 22 hold momentum necessary to move toward the lower part of the chamber. Further, the debris pass through a debris passage hole 24 of a catching chamber 23 formed in the lower part of the exhaust chamber 22 and reach the catching chamber 23 because of the momentum and gravity. As shown in FIG. 1, the debris passage hole 24 is formed in a funnel shape for collecting the debris at the center of the catching chamber 23 and preventing attachment of the debris to the wall surfaces of the catching chamber 23.

A collecting unit 25 is provided under the catching chamber 23. The collecting unit 25 has a gate valve 26, an evacuating unit 27, a collecting container connecting part 28, and a collecting container 29. The catching chamber 23 is connected to the collecting container 29 provided under the collecting unit 25 via the gate valve 26. When the amount of debris caught in the catching chamber 23 reaches a certain amount, the gate valve 26 is opened after the interior of the collecting container 29 communicating with the gate valve 26 is evacuated to vacuum by the evacuating unit 27. Thereby, the debris caught in the catching chamber 23 drop into the collecting container 29. Then, the gate valve 26 is closed and the air is introduced into the collecting container 29 by using a leak valve (not shown). The debris can be taken out by detaching the collecting container 29 from the collecting container connecting part 28. The collecting container 29 can be connected to the collecting container connecting part 28 and used again by cleaning the collecting container 29 after the debris are taken out of the collecting container 29. The amount of deposited debris may be detected by measuring the time of emitting the target material and/or the times of plasma generation by a timer, counter, or the like (not shown).

As explained above, according to the embodiment, almost all of the fast ions, neutral particles, and residual droplets generated following the EUV light generation can be collected during operation of the EUV light source. Therefore, the contamination of the chamber is reduced and the intervals of chamber cleaning operation can be greatly increased. Thereby, the operation time of the EUV light source required at a practical level can be achieved.

Figure 2:
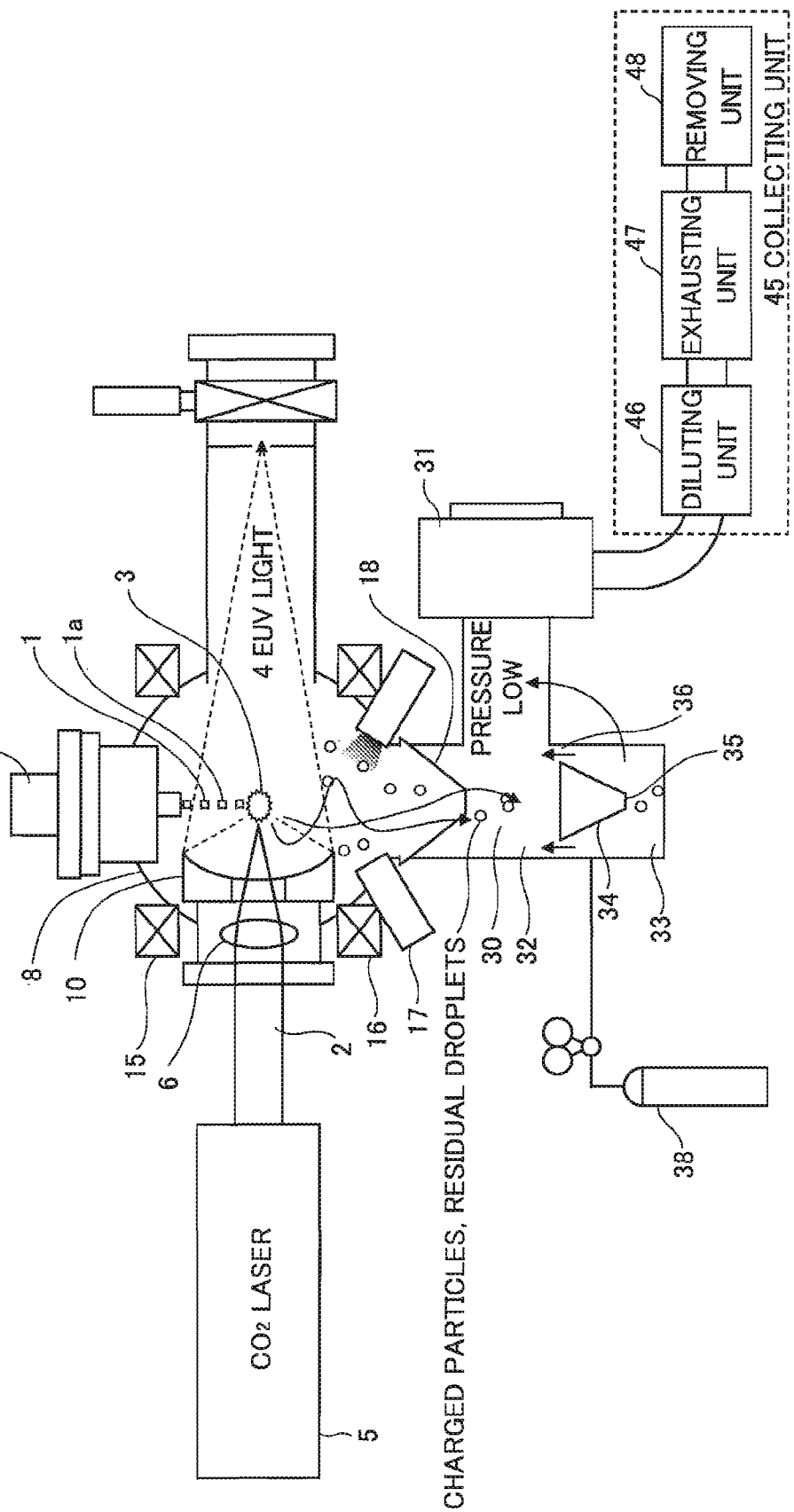
FIG. 2 shows an internal structure of an EUV light source apparatus according to the second embodiment of the present invention.

Next, referring to FIG. 2, the second embodiment of the present invention will be explained. In the second embodiment, the operation from plasma generation to immediately before introduction of debris to an exhaust path 30 is the same as the operation in the first embodiment. The debris of neutral particles, residual droplets, and so on collected in the lower part of the chamber 8 are guided to an exhaust chamber 32 under the chamber in the exhaust path 30 by a debris exhaust TMP (turbo molecular pump) 31 through a hole of a skimmer 18. The pressure in the exhaust chamber 32 is kept lower than the pressure within the chamber 8 by the debris exhaust TMP 31. The diameter of the hole of the skimmer 18 is several tens of micrometers to several millimeters. The diameter of the hole of the skimmer 18 is determined so that the residual droplets having the largest size among the products from the plasma can pass through. The sizes of the residual droplets change according to the target droplets and laser intensity. In the embodiment, for example, the diameter of the target droplets is 20 µm, the laser intensity is $10^9$ W/cm$^2$ or less, and the diameter of the hole of the skimmer 18 is 100 µm. Further, as shown in FIG. 2, the shape of the skimmer 18 is preferably formed in a conical shape downwardly projecting. This is for focusing the caught debris toward the central axis as far as from the walls of the exhaust chamber 32. The debris guided to the exhaust chamber 32 hold momentum necessary for moving toward the lower part of the chamber. The debris reach a catching and reaction chamber 33 through a debris passage hole 35 of a partition wall 34 formed in the upper part of the catching and reaction chamber 33 provided under the exhaust chamber 32 due to the momentum, gravity and the pressure difference when passing through the skimmer 18 and are caught. Further, the exhaust chamber 32 is constantly kept at the lower pressure than that of the chamber 8 by the skimmer 18, a reactive gas is prevented from diffusing in the chamber 8, which will be explained later.

The catching and reaction chamber 33 is filled with a reactive gas that reacts with the target material and generates a gas product at a certain pressure. The reactive gas is supplied by a reactive gas supply unit 38. When tin (Sn) is used as the target material, the catching and reaction chamber 33 is filled with hydrogen gas (H$_2$) at the atmospheric pressure at the normal temperature, for example, and the tin reacts with the hydrogen gas and SnH$_4$ gas is generated. The SnH$_4$ gas is generated because the boiling point of SnH$_4$ is −52° C. at the atmospheric pressure. Within the catching and reaction chamber 33, when the debris of tin are exposed to the reactive gas in sufficient time, all of the tin debris react with hydrogen to be SnH$_4$, and gasified. The pressure within the catching and reaction chamber 33 is higher than the pressure within the exhaust chamber, and a gas flow from the catching and reaction chamber 33 to the exhaust chamber 32 is generated.

Figure 3:
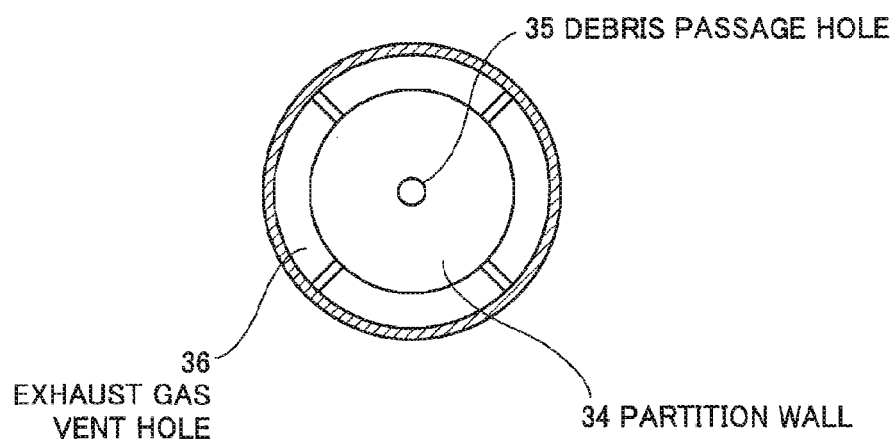
FIG. 3 shows a partition wall of the EUV light source apparatus according to the second embodiment of the present invention seen from above.

FIG. 3 shows the partition wall 34 seen from above. As shown in FIG. 2, the debris passage hole 35 is formed at the center of the partition wall 34, and exhaust gas vent holes 36 are formed on the outer circumference part of the partition wall 34. As shown in FIG. 2, the partition wall 34 is formed in a conical shape. The debris in the exhaust chamber 32 move through the debris passage hole 35 to the catching and reaction chamber 33, react with the reactive gas to be gasified into a reaction product gas in the catching and reaction chamber 33, pass through the exhaust gas vent holes 36 into the exhaust chamber 32, and are exhausted by the debris exhaust TMP 31.

In the partition wall 34 shown in FIG. 3, the opening sectional area of the exhaust gas vent holes 36 formed on the outer circumference part is set sufficiently larger than the opening sectional area of the debris passage hole 35. The ratio of the opening sectional area of the exhaust gas vent holes 36 to the opening sectional area of the debris passage hole 35 and the whole pressure loss are determined such that the catching and reaction chamber 33 is kept at certain pressure by the reactive gas and the sufficient pressure difference is kept between the catching and reaction chamber 33 and the exhaust chamber 32. On the other hand, the amount of flow of the reactive gas from the debris passage hole 35 is a very small value, and the debris can move through the debris passage hole 35 to the catching and reaction chamber 33. The magnitude relation in pressure among the respective chambers is such that (pressure of the catching and reaction chamber 33)>(pressure within the chamber)>(pressure of the exhaust chamber). In this manner, the debris can be caught while the reactive gas prevents the debris from diffusing in the chamber.

The reactive gas and the reaction product gas containing SnH$_4$ guided to the exhaust chamber 32 are guided to a collecting unit 45 by the debris exhaust TMP 31. The collecting unit 45 has a diluting unit 46, an exhausting unit 47, and a removing unit 48. The reactive gas and the reaction product gas guided to the exhaust chamber 32 are first guided to the diluting unit 46 of the collecting unit 45 by the debris exhaust TMP 31. It is difficult to treat the reactive gas and the reaction product gas guided to the exhaust chamber 32 as they are by the removing unit 48 and so on at the downstream, and the reactive gas and the reaction product gas are diluted with an inert gas in the diluting unit 46 for easy removing treatment in the removing unit 48 and so on at the downstream. As a dilution gas, nitrogen (N$_2$), helium (He), argon (Ar), or the like is used. The diluted reactive gas and reaction product gas are guided through the exhausting unit 47 to the removing unit 48. The exhausting unit 47 includes a pump for sending the diluted gas to the removing unit 48. Further, in the removing unit 48, the reaction product gas is removed from the light source apparatus by absorption or further reaction, and thereby, the debris can be collected.

In the removing unit 48, the reactive gas and the reaction product gas containing SnH$_4$ are absorbed by activated carbon filtration or the like. Accordingly, the reactive gas and the reaction product gas containing the target material hardly flow out of the removing unit 48. Instead of activated carbon filtration, the reactive gas and the reaction product gas may be absorbed by another material such as a foam metal or functional ceramics beads, for example. Further, the reactive gas and the reaction product gas containing SnH$_4$ may be allowed to chemically react with another material by oxidization or reduction for easy collecting.

In the second embodiment of the present invention, since the debris are allowed to react with the reactive gas and collected as the reaction product gas, the degree of freedom of choice regarding the transportation and treatment of the gasified debris is great. For example, the collecting operation can be performed even when the units 47, 48 at the downstream of the diluting unit 46 are provided outside of a clean room where the EUV light source apparatus is installed. Thereby, the clean room can be prevented from contaminating by the collected debris.

Figure 4:
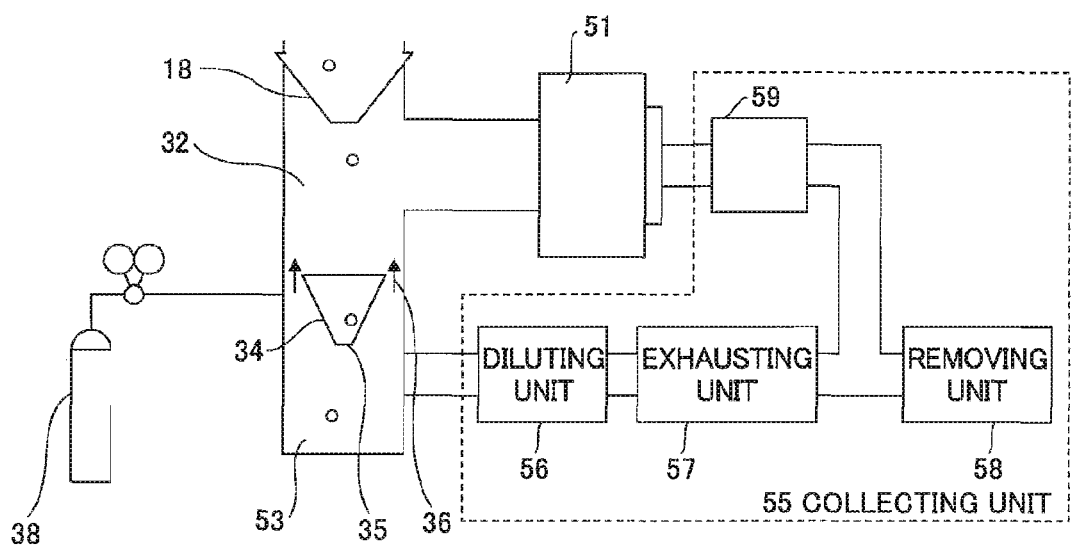
FIG. 4 shows an internal structure at the downstream side of an EUV light source apparatus according to the third embodiment of the present invention.

Next, referring to FIG. 4, the third embodiment of the present invention will be explained. The third embodiment of the present invention is the same as the second embodiment of the present invention shown in FIG. 2 in the configuration to the exhaust chamber 32, and FIG. 4 only shows the skimmer 18 and the downstream side of the third embodiment of the present invention, which differ from those of the second embodiment of the present invention. In the third embodiment of the present invention, a collecting unit 55 has a diluting unit 56, an exhausting unit 57, a removing unit 58, and an exhausting unit 59, and is connected to a catching and reaction chamber 53 and a debris exhaust TMP 51. That is, the diluting unit 56 and the exhausting unit 57 are connected to the catching and reaction chamber 53, and the reactive gas and the reaction product gas containing SnH$_4$ are diluted by the diluting unit 56 and sent to the removing unit 58 by the exhausting unit 57. The exhaust gas from the debris exhaust TMP 51 is also sent to the removing unit 58 via the exhausting unit 59. This is because the flow of the reactive gas and the reaction product gas from the catching and reaction chamber 53 into the exhaust chamber 32 is unavoidable for maintaining the pressure balance, and the reactive gas and the reaction product gas from the reaction chamber 53 via the exhaust chamber 32 to the debris exhaust TMP 51 can not completely be eliminated.

As explained above, in the third embodiment of the present invention, the amount of the reactive gas and the reaction product gas exhausted by the debris exhaust TMP 51 can be reduced. Since the amount of exhausted gas by the debris exhaust TMP 51 is reduced, the lower capacity of the debris exhaust TMP 51 can be available and the cost can be reduced. Although the total number of exhausting units is increased, the price of a typical pump is a fraction of the price of the TMP, and the effect of the reduced cost due to the lower capacity of the debris exhaust TMP 51 is great.

Figure 5:
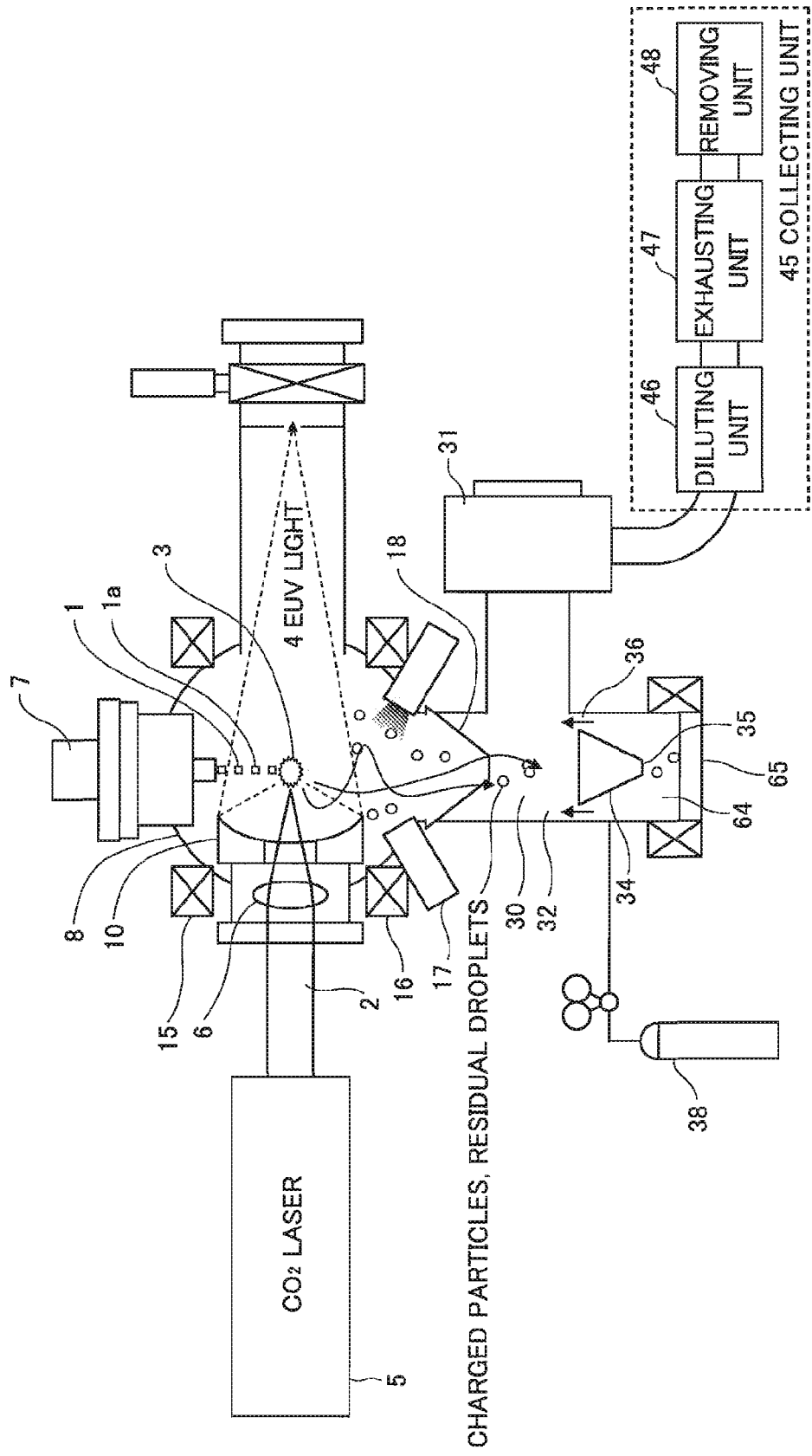
FIG. 5 shows an internal structure of an EUV light source apparatus according to the fourth embodiment of the present invention.

Next, referring to FIG. 5, the fourth embodiment of the present invention will be explained. The fourth embodiment of the present invention has a similar configuration to that of the second embodiment of the present invention, however, a heating unit 65 is provided in a catching and reaction chamber 63. That is, by heating the catching and reaction chamber 63, the reaction time taken for reaction of the debris and the reactive gas can be reduced and the reaction product gas can be efficiently generated from the debris. The heating unit 65 may be configured by providing a heater on the outer wall of the catching and reaction chamber 63, or providing an infrared lamp or plasma source.

Further, in the fourth embodiment of the present invention, the temperatures of the debris, the reactive gas, and the reaction product gas can be raised by heating the catching and reaction chamber 63, and the kinds of the usable reactive gas can be increased. FIG. 6 is a table of boiling points of reaction products of, for example, halogen gases (not the hydrogen gas) and tin at one atmosphere.

The reactive gas is heated in advance and the temperature of the reaction product as a result of the reaction with tin is equal to or more than the boiling point, and thereby, the debris can be extracted as the reaction product gas. Regarding the turbo-molecular pump, one that can be used at a high temperature of several hundreds of degrees C. has been developed, however, in practice, a reaction product having a boiling point of 250° C. or less is used. For example, chlorine or bromine is used as a reactive gas and allowed to react with tin debris, and thereby, the tin debris can be extracted as reaction product gas $SnCl_4$ or $SnBr_4$. The hydrogen gas is highly explosive, reaching the explosion limit at concentration of 4%, and carries risks. Accordingly, the control of hydrogen concentration is essential in the whole exhaust system, and there are many restrictions in configuration of the exhaust system. For example, using chlorine or bromine, the restrictions in use of hydrogen can be eliminated.

Figure 7:
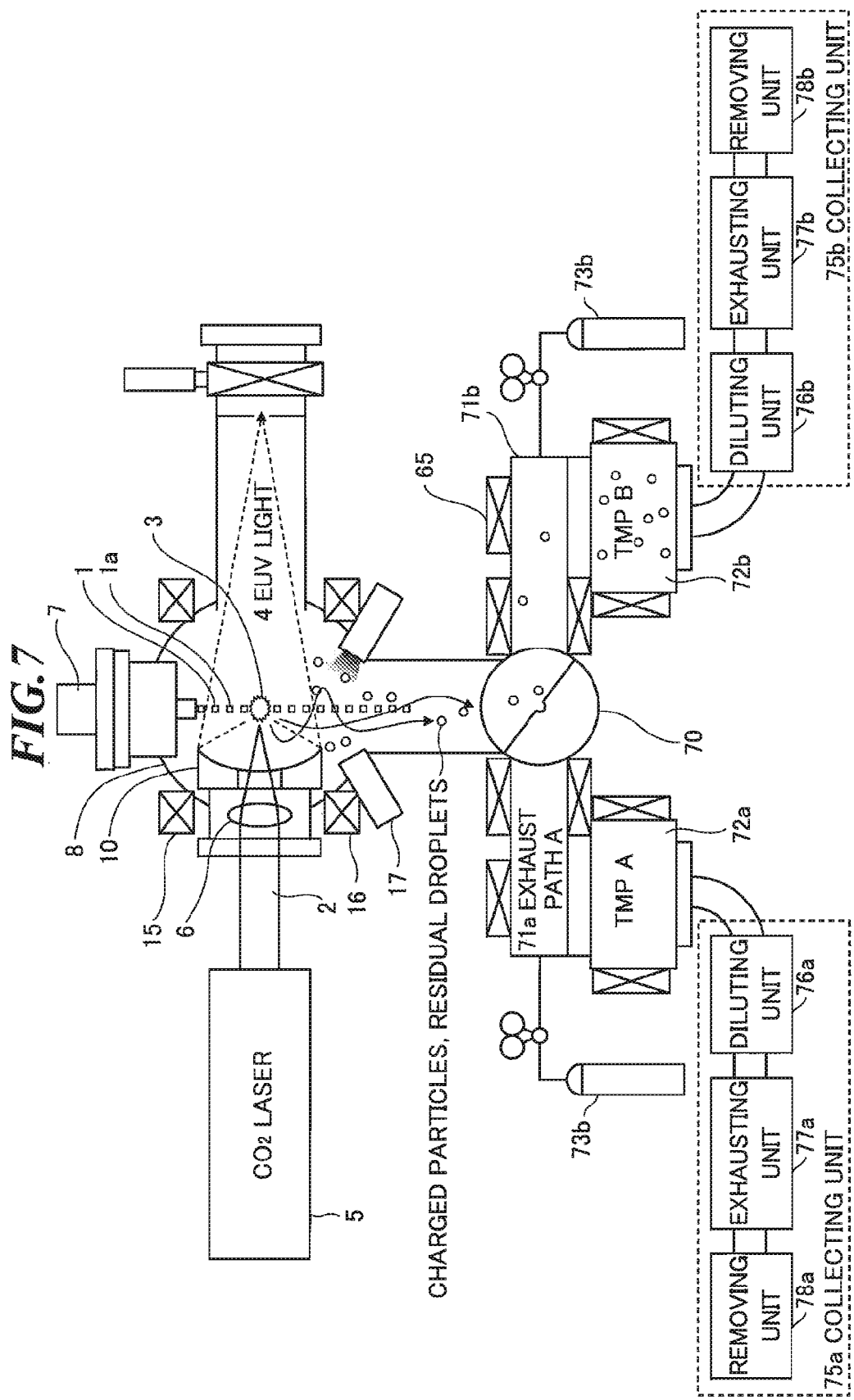
FIG. 7 shows an internal structure of an EUV light source apparatus according to the fifth embodiment of the present invention.

Next, referring to FIG. 7, the fifth embodiment of the present invention will be explained. In the fifth embodiment of the present invention, a switching valve 70 is provided between the exhaust path in which the reactive gas exists and the chamber 8, and the exhaust path and the chamber 8 are constantly partitioned by the switching valve 70. The operation from laser generation to debris collection is the same as that in the first to fourth embodiments of the present invention. Note that, in the fifth embodiment of the present invention, since the exhaust path and the chamber are constantly partitioned by the switching valve 70, the skimmer is not the essential configuration requirement of the embodiment and the skimmer may be omitted.

In the fifth embodiment of the present invention, plural exhaust paths may be provided. As shown in FIG. 7, the embodiment will be explained by taking the case where two exhaust path "A" 71a and exhaust path "B" 71b are provided as an example. The debris focused toward the axis in the lower part of the chamber pass the switching valve 70 and the exhaust path "B" 71b and reach a TMP "B" 72b. Here, the debris are deposited on the blades and wall surfaces within the TMP "B" 72b. When debris in an amount equal to or more than a certain amount are deposited on the blades and wall surfaces of the TMP, the amount of exhaust flow of the TMP becomes lower. Accordingly, by detecting the emission time of the target material and the times of plasma generation using a timer or counter, the switching valve 70 is switched and connected to a new exhaust path before the amount of exhaust flow of the TMP becomes lower.

While the debris in the lower part of the chamber are caught through the exhaust path "B" 71b to the TMP "B" 72b, in the exhaust path "A" 71a, the debris deposited in the TMP "A" 72a react with a reactive gas supplied from a reactive gas supply unit 73a and is gasified and a reaction product gas is generated. The reaction product gas is guided to a collecting unit 75a, and collected via a diluting unit 76a, an exhausting unit 77a by a removing unit 78a in the collecting unit 75a. Thereby, the TMP "A" 72a can be recycled and reused. In this regard, the reaction of the debris and the reactive gas may be accelerated by heating the exhaust path "A" 71a and/or the TMP "A" 72a with a heating unit. Further, in place of hydrogen, chlorine, bromine, or the like may be used as the reactive gas. When the reaction treatment of debris is ended and the TMP "A" 72a becomes reusable, the reactive gas supply is stopped and the diluting unit 76a is stopped. If the heating unit has been used, the heating unit is also stopped. Note that the exhausting unit 77a is not stopped but continuously operated as a back-pressure pump.

When the valve 70 is switched, the debris in the lower part of the chamber is guided to the exhaust path "A" 71a in which the debris treatment has been ended and the TMP "A" 72a becomes recyclable and reusable, and deposited in the TMP "A" 72a. Concurrently, the reactive gas is guided to the exhaust path "B" 71b and the TMP "B" 72b in which the debris have been deposited and reaction treatment of the debris and accompanying recycle of the TMP "B" 72b are performed, and the TMP "B" 72b becomes reusable. In this regard, the reaction treatment of debris may be promoted using a heating unit. By repeatedly performing the operation, the EUV light source apparatus can be continuously operated while collecting the debris.

In the fifth embodiment of the present invention, an advantage that the operation of depositing and accumulating the debris and the operation of gasifying and exhausting and collecting the debris can be concurrently and independently performed is obtained. Further, in the embodiment, unlike the second to fourth embodiments, there is no need to achieve the pressure balance among the chamber, the exhaust chamber, and the reaction chamber, and there is no restriction of pressure and temperature necessary for maintaining the pressure balance with respect to the reactive gas. Accordingly, the pressure and temperature of the reactive gas can be set to the most suitable condition for causing the debris deposited in the TMP for gasification.

Figure 8:
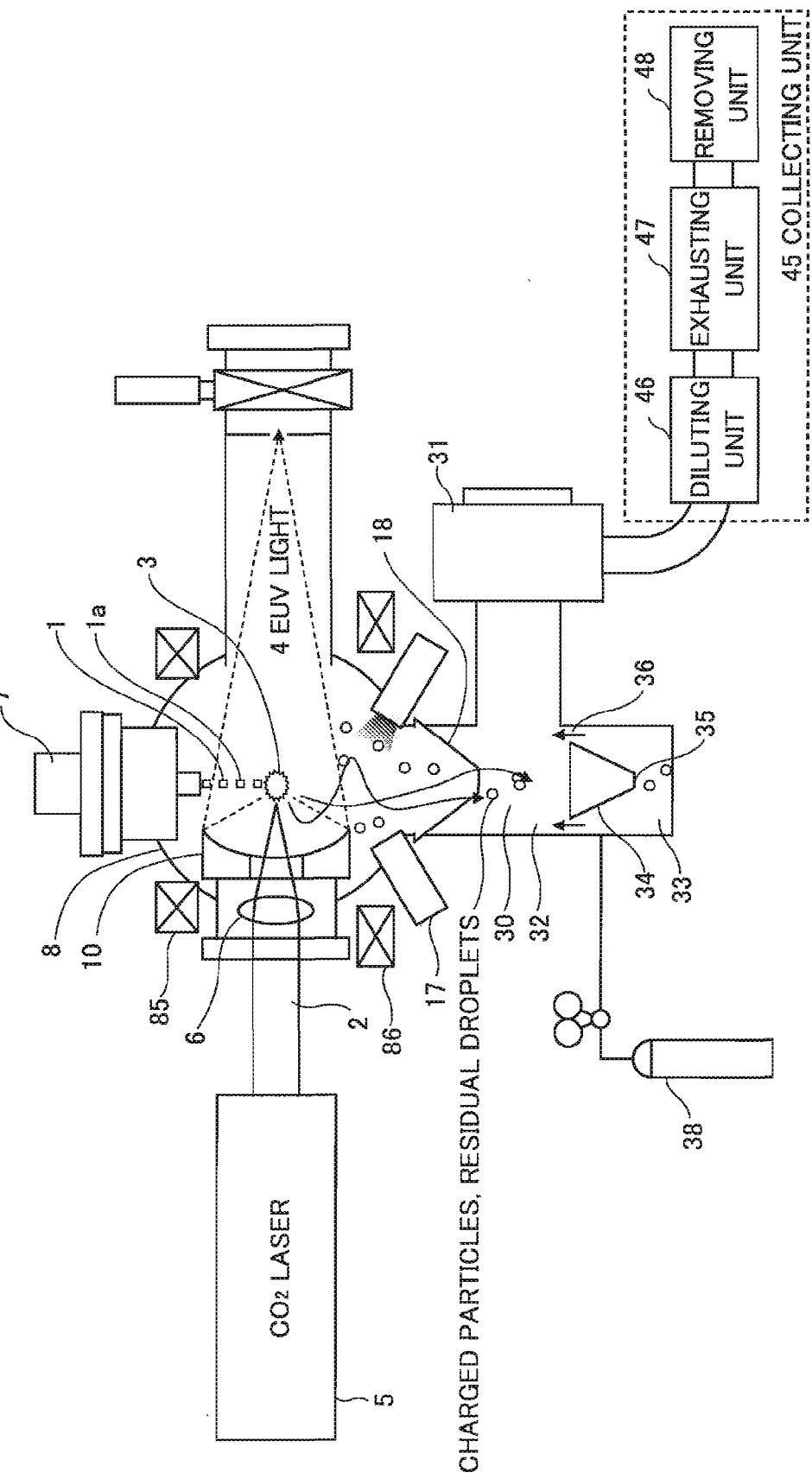
FIG. 8 shows an internal structure of an EUV light source apparatus according to the sixth embodiment of the present invention.

Referring to FIG. 8, the sixth embodiment of the present invention will be explained. The basic configuration of the sixth embodiment of the present invention is the same as the configuration of the second embodiment, but different in magnetic field arrangement. That is, the diameter of a lower coil 86 of an electromagnet is made larger than the diameter of an upper coil 85. Thereby, the magnetic field in the lower part of the chamber is smaller than the magnetic field in the upper part of the chamber, and the charged particles move toward the lower part of the chamber by the effect of the magnetic fields and removing of the charged particles is promoted. The basic operation of the embodiment is the same as the operation of the second embodiment, however, the collection efficiency of the debris in the lower part of the chamber can be improved because the magnetic field arrangement is changed.

Figure 9:
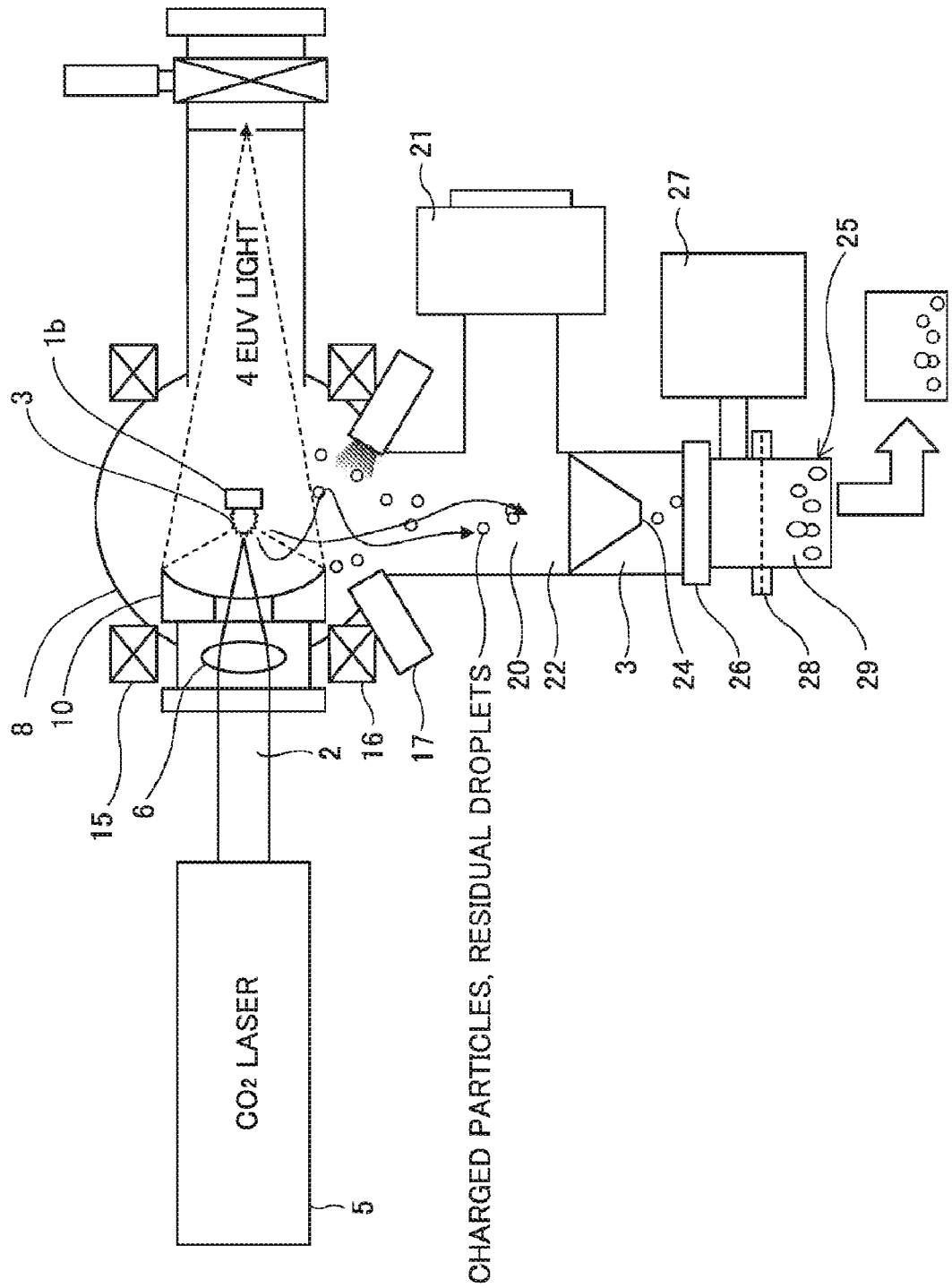
FIG. 9 shows an internal structure of an EUV light source apparatus according to the seventh embodiment of the present invention.
Figure 10:
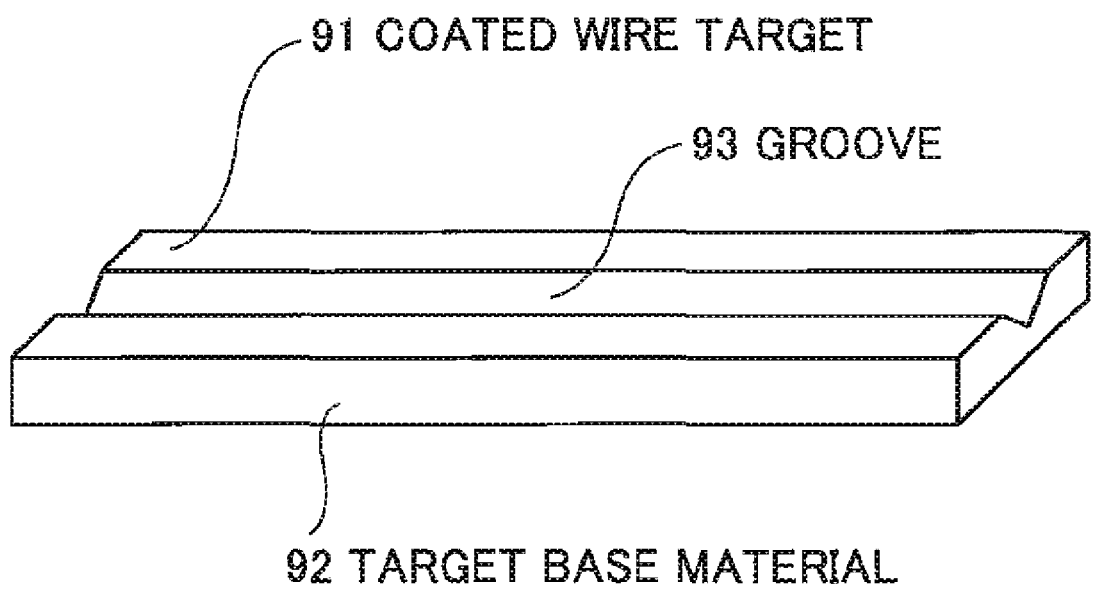
FIG. 10 shows a modified example of a coated wire of the EUV light source apparatus according to the seventh embodiment of the present invention.

Next, referring to FIG. 9, the seventh embodiment of the present invention will be explained. In the embodiment, as the target, a wire target is used in place of the droplet target. As shown in FIG. 9, the embodiment will be explained by taking the case of using a wire target 1b in place of the droplet target in the first embodiment as an example. When the wire target is used, a wire formed from a tin material may be introduced by a wire target moving unit (not shown) into the chamber and a laser may be always applied to a new surface of the wire by continuously sliding the wire. Further, a coated wire may be formed by coating the laser application surface with tin and used as a target. Using the coated wire, the strength of the target base material becomes easily held and the mechanical strength of the target can be held. Furthermore, FIG. 10 shows a modified example of the coated wire target. In a coated wire target 91 shown in FIG. 10, a groove 93 is formed in the laser application part of a target base material 92, the groove 93 part is coated with tin, and thereby, the coated wire target 91 is formed.

The operation and effect of the seventh embodiment of the present invention are the same as the operation and effect of the first embodiment, however, greatly different in the following point from the operation and effect of the first embodiment. That is, using the wire target 1b, specifically, the tin-coated wire 91, the residual droplets on which the influence of the magnetic field hardly act can be reduced. This is because the volume of tin flying due to application can be minimized by making the thickness of the tin coating nearly equal to the thickness that is removed by abrasion with a carbon dioxide laser. In the case of using the droplet target usually having a spherical shape, the whole volume of the tin in the deeper part than the thickness flying due to laser application becomes residual droplets. On the other hand, in the case of using the tin-coated wire 91, generation of the residual droplets can be reduced by setting the thickness of the tin coating to a suitable value. If the residual droplets are reduced, most of the rest of the debris become minute particles, and the collection efficiency of the debris by the magnetic field is dramatically increased by charging the minute particles.

The invention claimed is:

1. An extreme ultra violet light source apparatus for generating extreme ultra violet light from plasma by irradiating a target with a laser beam generated by a driver laser, said apparatus comprising:
    a chamber installed in a clean room and in which extreme ultra violet light is generated;
    a collector mirror provided within said chamber, for collecting the extreme ultra violet light radiated from the plasma;
    a reactive gas supply unit for supplying a reactive gas to a space communicated with said chamber;
    a magnetic field generating device including a coil for generating a magnetic field in said chamber;
    an exhaust path connected to said chamber;
    a first exhausting unit provided in said exhaust path; and
    a collecting unit connected to an exhaust side of said first exhausting unit, for collecting a reaction product gas produced by reaction of debris and the reactive gas, said collecting unit including a diluting unit for diluting the reaction product gas, a second exhausting unit for sending the diluted reaction product gas, and a removing unit for collecting the reaction product gas, at least a part of said collecting unit being installed out of said clean room.

2. The extreme ultra violet light source apparatus according to claim 1, wherein said target includes tin (Sn).

3. The extreme ultra violet light source apparatus according to claim 1, wherein said target includes a droplet target.

4. The extreme ultra violet light source apparatus according to claim 1, further comprising:
    a catching and reaction chamber for catching debris generated from the plasma; and
    a heating device provided in said catching and reaction chamber.

5. The extreme ultra violet light source apparatus according to claim 1, wherein said reactive gas includes a hydrogen gas.

6. An extreme ultra violet light source apparatus for generating extreme ultra violet light from plasma by irradiating a target with a laser beam generated by a driver laser, said apparatus comprising:
    a chamber installed in a clean room and in which extreme ultra violet light is generated;
    a collector mirror provided within said chamber, for collecting the extreme ultra violet light radiated from the plasma;
    a catching and reaction chamber for catching debris generated from the plasma;
    an exhaust path connected between said chamber and said catching and reaction chamber;
    a reactive gas supply unit for supplying a reactive gas to said catching and reaction chamber;
    a first exhausting unit provided in said exhaust path; and
    a collecting unit connected to an exhaust side of said first exhausting unit, for collecting a reaction product gas produced by reaction of the debris and the reactive gas, said collecting unit including a diluting unit for diluting the reaction product gas, a second exhausting unit for sending the diluted reaction product gas, and a removing unit for collecting the reaction product gas, at least a part of said collecting unit being installed out of said clean room.

7. The extreme ultra violet light source apparatus according to claim 6, further comprising:
    a heating device provided in said catching and reaction chamber.

8. The extreme ultra violet light source apparatus according to claim 6, further comprising:
    a magnetic field generating device including a coil that generates a magnetic field for focusing charged debris.

9. The extreme ultra violet light source apparatus according to claim 8, further comprising:
    a charging device for charging neutral particles.

10. The extreme ultra violet light source apparatus according to claim 6, further comprising:
    a magnetic field generating device including at least two coils that generate magnetic fields for focusing charged debris, wherein a diameter of a coil at an exhaust path side is larger than a diameter of a coil at an opposite side to said exhaust path.

11. The extreme ultra violet light source apparatus according to claim 6, wherein said target includes a wire target.

12. The extreme ultra violet light source apparatus according to claim 11, wherein said wire target includes a coated wire target.

13. The extreme ultra violet light source apparatus according to claim 6, wherein said target includes tin (Sn).

14. The extreme ultra violet light source apparatus according to claim 6, wherein said target includes a droplet target.

15. The extreme ultra violet light source apparatus according to claim 6, wherein said reactive gas includes a hydrogen gas.

16. The extreme ultra violet light source apparatus according to claim 6, wherein the second exhausting unit is a pump disposed between the diluting unit and the removing unit, for sending the diluted reaction product gas to the removing unit.

\* \* \* \* \*